United States Patent
He et al.

(10) Patent No.: US 9,455,673 B2
(45) Date of Patent: Sep. 27, 2016

(54) AUTO-ZERO CIRCUIT OF OPERATIONAL AMPLIFIER

(71) Applicant: Shenzhen China Star Optoelectronics Technology Co., Ltd., Guangdong (CN)

(72) Inventors: Jian He, Guangdong (CN); Shen-Sian Syu, Guangdong (CN); Yugang Bao, Guangdong (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 1 day.

(21) Appl. No.: 14/416,047

(22) PCT Filed: Nov. 18, 2014

(86) PCT No.: PCT/CN2014/091467
§ 371 (c)(1),
(2) Date: Jan. 20, 2015

(87) PCT Pub. No.: WO2016/074261
PCT Pub. Date: May 19, 2016

(65) Prior Publication Data
US 2016/0134247 A1 May 12, 2016

(30) Foreign Application Priority Data

Nov. 11, 2014 (CN) .......................... 2014 1 0631248

(51) Int. Cl.
*H03F 3/45* (2006.01)
*H03F 1/30* (2006.01)

(52) U.S. Cl.
CPC ........... *H03F 1/30* (2013.01); *H03F 2200/261* (2013.01); *H03F 2203/45286* (2013.01)

(58) Field of Classification Search
CPC ............. H03F 1/02; H03F 3/005; H03F 3/45
USPC ................................ 330/9, 69, 256; 327/307
See application file for complete search history.

(56) References Cited

U.S. PATENT DOCUMENTS 6,111,965 A * 8/2000 Lubbe ..................... H03F 1/304
327/307

* cited by examiner

Primary Examiner — Steven J Mottola

(57) ABSTRACT

An auto-zero circuit of an operational amplifier is disclosed, and the auto-zero circuit has: a micro-control unit and a digital potentiometer; the micro-control unit is used to obtain a voltage value of an offset voltage of the output end when there is no input in the operational amplifier, and generates a control signal which causes the voltage value of the offset voltage to be smaller than a first threshold value according to the voltage value of the offset voltage; the digital potentiometer is used to adjust a resistance thereof according to the control signal.

18 Claims, 3 Drawing Sheets

AUTO-ZERO CIRCUIT OF OPERATIONAL AMPLIFIER

RELATED APPLICATIONS

This application is a National Phase of PCT Patent Application No. PCT/CN2014/091467 having International filing date of Nov. 18, 2014, which claims the benefit of priority of Chinese Patent Application No. 201410631248.8 filed on Nov. 11, 2014. The contents of the above applications are all incorporated by reference as if fully set forth herein in their entirety.

FIELD OF THE INVENTION

The present invention relates to a calibration technology of an operational amplifier, and more particularly to an auto-zero circuit of an operational amplifier.

BACKGROUND OF THE INVENTION

Operational amplifiers are being widely applied. In the operation process of the operational amplifier, due to the working principle and environment effects, a voltage drift occurs so as to output an offset voltage, which affects the measurement sensitivity of the entire system.

Recently, the structural diagram of an existing auto-zero circuit of an operational amplifier is illustrated in FIG. 1, wherein Vi is input voltage, Vo is output voltage, and there are two power-line terminals +VCC and −VEE. Through setting an adjustable resistance to regulate a current between two auto-zero terminals, the offset voltage which the operational amplifier outputs is reduced. However, an artificial auto-zero operational process is more complex and needs a long regulating time, so that is hard to ensure accuracy; simultaneously, the operational amplifier circuit is often built in a fixture, so the artificial auto-zero operation has some limitations.

As a result, it is necessary to provide an auto-zero circuit of an operational amplifier to solve the problems existing in the conventional technologies.

SUMMARY OF THE INVENTION

A primary object of the present invention is to provide an auto-zero circuit of an operational amplifier, which solves the inaccuracy of the auto-zero operation of the existing operational amplifier so as to improve the measurement sensitivity.

To solve the above problem, the technical solution of the present invention is as follows:

An auto-zero circuit of an operational amplifier is provided in an embodiment of the present invention, and comprises:

an operational amplifier including an input end, an output end and an auto-zero end, wherein the input end receives a input signal; the output end processes the input signal to generate an output signal; and the auto-zero end executes an auto-zero operation for the operational amplifier;

an analog-to-digital converter converting the output signal to a digital signal;

a micro-control unit obtaining a voltage value of an offset voltage of the output end according to the digital signal when there are no input signals in the input end, wherein the micro-control unit compares an amplitude of the offset voltage to a first threshold value so as to generate a comparison result and generate a control signal according to the comparison result, wherein the control signal causes the voltage value of the offset voltage to be smaller than the first threshold value;

a digital potentiometer adjusting a resistance thereof according to the control signal, in order to execute the auto-zero operation for the operational amplifier; and a temperature sensing module detecting a current environment temperature and recording an initial temperature after finishing the previous auto-zero operation.

In the auto-zero circuit of the operational amplifier of the present invention, the micro-control unit further generates the control signal when the comparison result is that the amplitude of the offset voltage is greater than the first threshold value.

In the auto-zero circuit of the operational amplifier of the present invention, the digital potentiometer comprises a first digital potentiometer and a second digital potentiometer, the first digital potentiometer significantly adjusts the resistance; and the second digital potentiometer slightly adjusts the resistance.

In the auto-zero circuit of the operational amplifier of the present invention, the micro-control unit further adjusts a resistance of the first digital potentiometer when the amplitude of the offset voltage is greater than a second threshold value so as to cause the amplitude of the offset voltage to be smaller than or equal to the second threshold value;

wherein the micro-control unit adjusts a resistance of the second digital potentiometer when the amplitude of the offset voltage is smaller than or equal to the second threshold value so as to cause the amplitude of the offset voltage to be smaller than or equal to the first threshold value, wherein the second threshold value is greater than the first threshold value.

In the auto-zero circuit of the operational amplifier of the present invention, the micro-control unit further generates a prompt signal according to the current environment temperature and the initial temperature, in order to trigger the operational amplifier to execute the auto-zero operation.

In the auto-zero circuit of the operational amplifier of the present invention, the micro-control unit further obtains a voltage value of a current offset voltage of the output end corresponding to the current environment temperature according to the current environment temperature; the micro-control unit obtains a voltage value of an initial offset voltage of the output end corresponding to the initial temperature according to the initial temperature; and the micro-control unit generates a prompt signal according to the voltage value of the current offset voltage and the voltage value of the initial offset voltage, in order to trigger the operational amplifier to execute the auto-zero operation.

In the auto-zero circuit of the operational amplifier of the present invention, the micro-control unit further determines whether the difference between the voltage value of the current offset voltage and the voltage value of the initial offset voltage is greater than a third threshold value, in order to generate a determination result.

In the auto-zero circuit of the operational amplifier of the present invention, the micro-control unit further triggers the operational amplifier to execute the auto-zero operation when the determination result is that the difference between the voltage value of the current offset voltage and the voltage value of the initial offset voltage is greater than the third threshold value.

An auto-zero circuit of an operational amplifier is provided in an embodiment of the present invention, and comprises:

an operational amplifier including an input end, an output end and an auto-zero end, wherein the input end receives a input signal; the output end processes the input signal to generate an output signal; and the auto-zero end executes an auto-zero operation for the operational amplifier;

an analog-to-digital converter converting the output signal to a digital signal;

a micro-control unit obtaining a voltage value of an offset voltage of the output end according to the digital signal when there are no input signals in the input end, and generating a control signal according to the voltage value of the offset voltage, wherein the control signal causes the voltage value of the offset voltage to be smaller than a first threshold value; and a digital potentiometer adjusting a resistance thereof according to the control signal, in order to execute the auto-zero operation for the operational amplifier.

In the auto-zero circuit of the operational amplifier of the present invention, the micro-control unit further compares an amplitude of the offset voltage to the first threshold value so as to generate a comparison result and generates the control signal according to the comparison result.

In the auto-zero circuit of the operational amplifier of the present invention, the micro-control unit further generates the control signal when the comparison result is that the amplitude of the offset voltage is greater than the first threshold value.

In the auto-zero circuit of the operational amplifier of the present invention, the digital potentiometer comprises a first digital potentiometer and a second digital potentiometer, the first digital potentiometer significantly adjusts the resistance; and the second digital potentiometer slightly adjusts the resistance.

In the auto-zero circuit of the operational amplifier of the present invention, the micro-control unit further adjusts a resistance of the first digital potentiometer when the amplitude of the offset voltage is greater than a second threshold value so as to cause an amplitude of the offset voltage to be smaller than or equal to the second threshold value;

wherein the micro-control unit adjusts a resistance of the second digital potentiometer when the amplitude of the offset voltage is smaller than or equal to the second threshold value so as to cause the amplitude of the offset voltage to be smaller than or equal to the first threshold value, wherein the second threshold value is greater than the first threshold value.

In the auto-zero circuit of the operational amplifier of the present invention, the auto-zero circuit further comprises a temperature sensing module, wherein the temperature sensing module detects a current environment temperature and records an initial temperature after finishing the previous auto-zero operation.

In the auto-zero circuit of the operational amplifier of the present invention, the micro-control unit further generates a prompt signal according to the current environment temperature and the initial temperature, in order to trigger the operational amplifier to execute the auto-zero operation.

In the auto-zero circuit of the operational amplifier of the present invention, the micro-control unit further obtains a voltage value of a current offset voltage of the output end corresponding to the current environment temperature according to the current environment temperature; the micro-control unit obtains a voltage value of an initial offset voltage of the output end corresponding to the initial temperature according to the initial temperature; and the micro-control unit generates a prompt signal according to the voltage value of the current offset voltage and the voltage value of the initial offset voltage, in order to trigger the operational amplifier to execute the auto-zero operation.

In the auto-zero circuit of the operational amplifier of the present invention, the micro-control unit further determines whether the difference between the voltage value of the current offset voltage and the voltage value of the initial offset voltage is greater than a third threshold value, in order to generate a determination result.

In the auto-zero circuit of the operational amplifier of the present invention, the micro-control unit further triggers the operational amplifier to execute the auto-zero operation when the determination result is that the difference between the voltage value of the current offset voltage and the voltage value of the initial offset voltage is greater than the third threshold value.

The auto-zero circuit of an operational amplifier of the present invention solves the inaccuracy of the auto-zero operation of the existing operational amplifier through designing an improved auto-zero circuit, so as to improve the measurement sensitivity.

To allow the above description of the present invention to be more clear and comprehensive, there are preferred embodiments with the accompanying figures described in detail below.

DETAILED DESCRIPTION OF THE PREFERRED EMBODIMENTS

Figure 1:
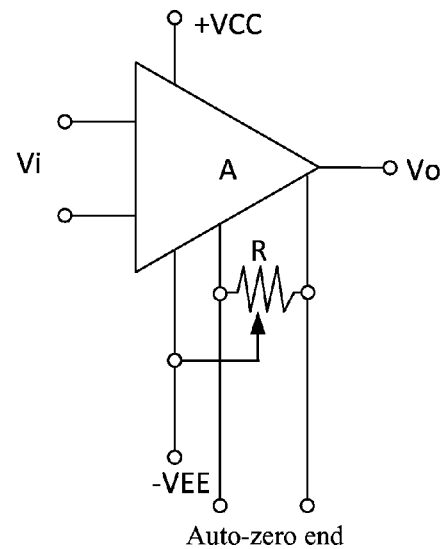
FIG. 1 is a structural diagram of an existing auto-zero circuit of an operational amplifier.

The structure and the technical means adopted by the present invention to achieve the above and other objects can be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, etc., are only directions by referring to the accompanying drawings, and thus the used directional terms are used to describe and understand the present invention, but the present invention is not limited thereto.

In the drawings, units with similar structures are represented with the same label.

Figure 2:
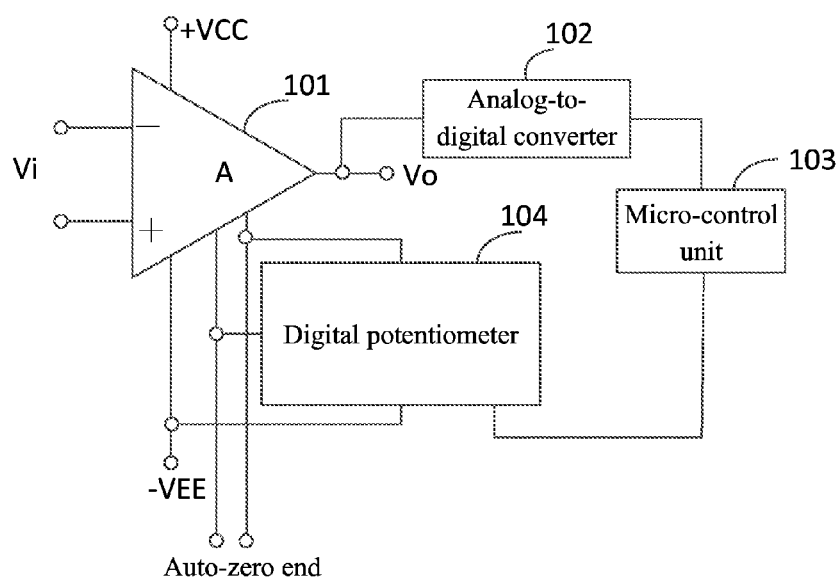
FIG. 2 is a structural diagram of an auto-zero circuit of an operational amplifier according to a first embodiment of the present invention.

Referring to FIG. 2, FIG. 2 is a structural diagram of an auto-zero circuit of an operational amplifier according to a first embodiment of the present invention.

An auto-zero circuit of an operational amplifier of the present invention comprises: an operational amplifier 101, an analog-to-digital converter 102, a micro-control unit 103 and a digital potentiometer 104. The operational amplifier 101 includes an input end, an output end and auto-zero ends. There are two auto-zero ends and the two power-line terminals which are +VCC and −VEE respectively; the input end receives input signal Vi, the output end processes the input signal to generate an output signal Vo, and the auto-zero end executes an auto-zero operation for the operational amplifier 101. One end of the analog-to-digital converter 102 is connected to the output end of the operational amplifier 101, and the other end thereof is connected to one end of the micro-control unit 103; the other end of the micro-control unit 103 is connected to the digital potentiometer 104. The digital potentiometer 104 is connected to the auto-zero end. The digital potentiometer 104 is further connected to the power-line terminal −VEE, and the power-line terminal −VEE provides power to the digital potentiometer 104.

Since the output signal of the operational amplifier 101 is generally an analog signal, there is need to convert the output signal of the operational amplifier 101 to a digital signal through the analog-to-digital converter 102 in order to implement the analog-to-digital converting.

When the auto-zero circuit of the operational amplifier works, the input end of the operational amplifier is closed firstly, and thus there are no input signals in the input end. At this time, the micro-control unit 103 obtains a voltage value of an offset voltage of the output end according to the digital signal which the analog-to-digital converter 102 converts; the micro-control unit 103 generates a control signal according to the voltage value of the offset voltage, wherein the control signal causes the voltage value of the offset voltage to be smaller than a first threshold value. The first threshold value can be set by the requirement of the actual measurement accuracy, and the first threshold value is close to zero.

By using the control signal generated by the micro-control unit 103 to adjust the resistance of the digital potentiometer 104, an auto-zero operation for the operational amplifier 101 can be executed. The micro-control unit 103 controls the voltage value of the offset voltage to fulfill the requirement, so as to implement the auto-zero operation for the operational amplifier.

The auto-zero circuit of an operational amplifier of the present invention solves the inaccuracy of the auto-zero operation of the existing operational amplifier through designing an improved auto-zero circuit, so as to improve the measurement sensitivity.

Figure 3:
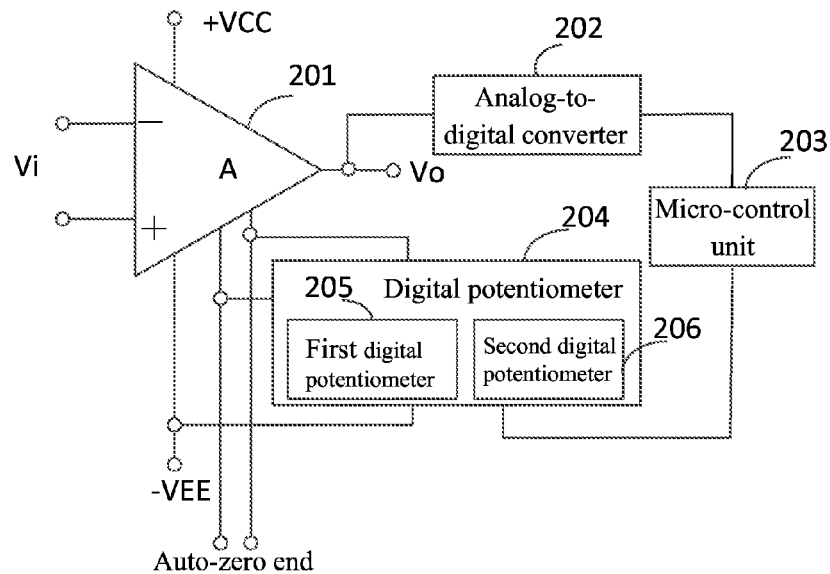
FIG. 3 is a structural diagram of an auto-zero circuit of an operational amplifier according to a second embodiment of the present invention.

Referring to FIG. 3, FIG. 3 is a structural diagram of an auto-zero circuit of an operational amplifier according to a second embodiment of the present invention.

Combined with FIG. 3, an auto-zero circuit of an operational amplifier of the present invention comprises: an operational amplifier 201, an analog-to-digital converter 202, a micro-control unit 203 and a digital potentiometer 204. The operational amplifier 201 includes an input end, an output end and auto-zero ends. The two power-line terminals are +VCC and −VEE respectively; the input end receives input signal Vi, the output end processes the input signal to generate an output signal Vo, and the auto-zero end executes an auto-zero operation for the operational amplifier 201. One end of the analog-to-digital converter 202 is connected to the output end of the operational amplifier 201, and the other end thereof is connected to one end of the micro-control unit 203; the other end of the micro-control unit 203 is connected to the digital potentiometer 204; the digital potentiometer 204 is connected to the auto-zero end; the digital potentiometer 204 is further connected to the power-line terminal −VEE, and the power-line terminal −VEE provides power to the digital potentiometer 204.

There are two auto-zero ends, the digital potentiometer 204 can include a first digital potentiometer 205 and a second digital potentiometer 206. The first digital potentiometer 205 significantly adjusts the resistance; and the second digital potentiometer 206 slightly adjusts the resistance. The first digital potentiometer 205 is connected to one of the two auto-zero ends, and the second digital potentiometer 206 is connected to the other auto-zero end.

Since the output signal of the operational amplifier 201 is generally an analog signal, there is need to convert the output signal of the operational amplifier 201 to a digital signal through the analog-to-digital converter 202, in order to implement the analog-to-digital converting.

When the auto-zero circuit of the operational amplifier works, the input end of the operational amplifier is closed firstly, and thus there are no input signals in the input end. At this time, the micro-control unit 203 obtains a voltage value of an offset voltage of the output end according to the digital signal which the analog-to-digital converter 202 converts; the micro-control unit 203 compares the obtained amplitude of the offset voltage to the first threshold value so as to generate a comparison result; the micro-control unit 203 generates the control signal when the comparison result is that the amplitude of the offset voltage is greater than the first threshold value, wherein the control signal causes the voltage value of the offset voltage to be smaller than a first threshold value; the first threshold value can be set by the requirement of the actual measurement accuracy, and the first threshold value is close to zero.

When the comparison result is that the amplitude of the offset voltage is smaller than or equal to the first threshold value, the control signal is not generated, namely, the auto-zero operation for the operational amplifier is not executed.

By using the control signal generated by the micro-control unit 203 to adjust the resistance of the digital potentiometer 204, an auto-zero operation for the operational amplifier 201 can be executed. The micro-control unit 203 controls the voltage value of the offset voltage to fulfill the requirement, so as to implement the auto-zero operation for the operational amplifier.

In order to achieve a better auto-zero result, the second threshold value can be set up, and the second threshold value is much greater than the first threshold value. When the amplitude of the offset voltage is greater than the second threshold value, the micro-control unit 203 significantly adjusts the resistance of the digital potentiometer, namely, the micro-control unit 203 adjusts the resistance of the first digital potentiometer 205; when the amplitude of the offset voltage is smaller than or equal to the second threshold value, the micro-control unit 203 stops the significant adjusting operation;

When the amplitude of the offset voltage is smaller than or equal to the second threshold value, the micro-control unit 203 slightly adjusts the resistance of the digital potentiometer, namely, the micro-control unit 203 adjusts the resistance of the second digital potentiometer 206. When the amplitude of the offset voltage is smaller than or equal to the first threshold value, the micro-control unit 203 stops the adjusting operation.

The auto-zero circuit of an operational amplifier of the present invention solves the inaccuracy of the auto-zero operation of the existing operational amplifier through designing an improved auto-zero circuit, so as to improve the measurement sensitivity.

Figure 4:
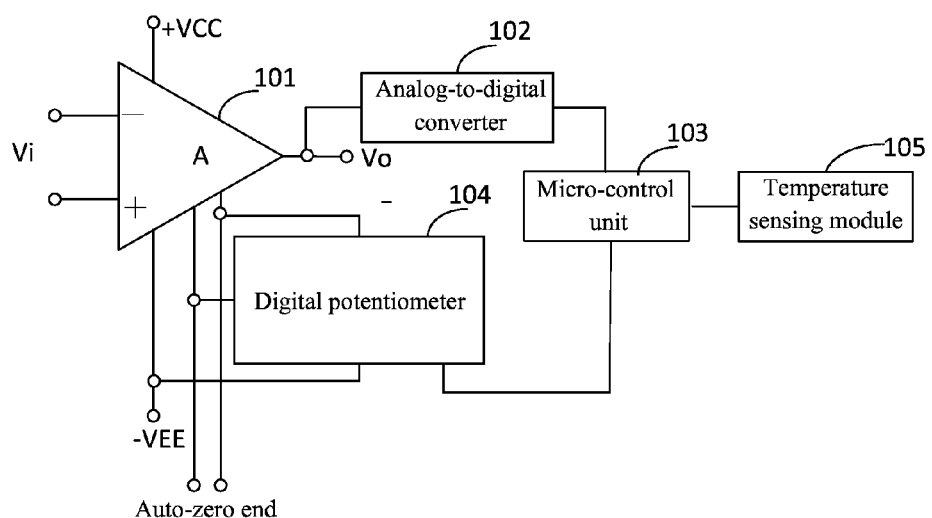
FIG. 4 is a structural diagram of an auto-zero circuit of an operational amplifier according to a third embodiment of the present invention.

Referring to FIG. 4, FIG. 4 is a structural diagram of an auto-zero circuit of an operational amplifier according to a third embodiment of the present invention.

The difference between the present embodiment and the first embodiment is: the auto-zero circuit of the operational amplifier of the present embodiment can comprise a temperature sensing module 105. Since the temperature affects the offset voltage of the operational amplifier significantly, there is a need to set up the temperature sensing module 105 in order to maintain the offset voltage at a low-level for a long time.

After finishing one auto-zero operation, the temperature sensing module 105 detects a current environment temperature and records an initial temperature after finishing the previous auto-zero operation.

Figure 5:
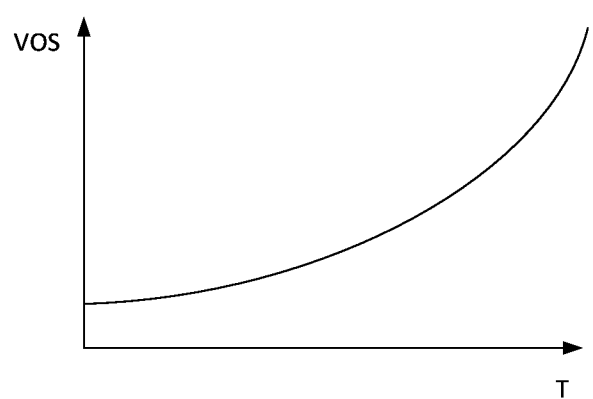
FIG. 5 is a temperature-offset voltage curve according to the third embodiment of the present invention.

The micro-control unit 104 obtains a voltage value of a current offset voltage of the output end corresponding to the current environment temperature according to the current environment temperature which is detected by the temperature sensing module 105 and obtains a voltage value of an initial offset voltage of the output end corresponding to the initial temperature according to the initial temperature. The voltage value of the current offset voltage of the output end corresponding to the current environment temperature can be obtained by a temperature-offset voltage curve; the temperature-offset voltage curve is illustrated in FIG. 5. The x-coordinate represents the temperature T, and the y-coordinate represents the offset voltage VOS. The voltage value of the initial offset voltage of the output end corresponding to the initial temperature can be also obtained by the temperature-offset voltage curve.

Moreover, the micro-control unit 104 determines whether the difference between the voltage value of the current offset voltage and the voltage value of the initial offset voltage is greater than a third threshold value, in order to generate a determination result. The third threshold value can be set by the requirement of the actual measurement accuracy. The micro-control unit 104 generates a prompt signal when the determination result is that the difference between the voltage value of the current offset voltage and the voltage value of the initial offset voltage is greater than the third threshold value, for example, an alarm to trigger the operational amplifier to execute the auto-zero operation. The micro-control unit does not generate a prompt signal when the determination result of the micro-control unit is that the difference between the voltage value of the current offset voltage and the voltage value of the initial offset voltage is smaller than or equal to the third threshold value and without triggering the operational amplifier to execute the auto-zero operation.

The temperature sensing module 105 detects the temperature changes in the real-time, thereby avoiding the offset voltage exceeding the first threshold value again when the temperature change is large. Through the prompt signal which is transmitted by the temperature sensing module 105, the operational amplifier executes the auto-zero operation, so as to maintain the offset voltage at a low-level for a long time. The technical solution of the present embodiment is also adapted for the second embodiment.

The auto-zero circuit of the operational amplifier of the present invention can avoid the temperature affecting the offset voltage through adding a temperature sensing module, so that the offset voltage can be maintained at a low-level for a long time.

In summary, the present invention has been disclosed with preferred embodiments thereof, but the above described preferred embodiments are not intended to limit the present invention. Those who are skilled in the art can make many changes and modifications to the described embodiment which can be carried out without departing from the scope and the spirit of the invention that is intended to be limited only by the appended claims.

What is claimed is:

1. An auto-zero circuit of an operational amplifier, comprising:
    an operational amplifier including an input end, an output end and an auto-zero end, wherein the input end receives a input signal; the output end processes the input signal to generate an output signal; and the auto-zero end executes an auto-zero operation for the operational amplifier;
    an analog-to-digital converter converting the output signal to a digital signal;
    a micro-control unit obtaining a voltage value of an offset voltage of the output end according to the digital signal when there are no input signals in the input end, wherein the micro-control unit compares an amplitude of the offset voltage to a first threshold value so as to generate a comparison result and generate a control signal according to the comparison result, wherein the control signal causes the voltage value of the offset voltage to be smaller than the first threshold value;
    a digital potentiometer adjusting a resistance thereof according to the control signal, in order to execute the auto-zero operation for the operational amplifier; and
    a temperature sensing module detecting a current environment temperature and recording an initial temperature after finishing the previous auto-zero operation.

2. The auto-zero circuit of the operational amplifier according to claim 1, wherein the micro-control unit further generates the control signal when the comparison result is that the amplitude of the offset voltage is greater than the first threshold value.

3. The auto-zero circuit of the operational amplifier according to claim 1, wherein the digital potentiometer comprises a first digital potentiometer and a second digital potentiometer, the first digital potentiometer significantly adjusts the resistance; and the second digital potentiometer slightly adjusts the resistance.

4. The auto-zero circuit of the operational amplifier according to claim 3, wherein the micro-control unit further adjusts a resistance of the first digital potentiometer when the amplitude of the offset voltage is greater than a second threshold value so as to cause the amplitude of the offset voltage to be smaller than or equal to the second threshold value;
    wherein the micro-control unit adjusts a resistance of the second digital potentiometer when the amplitude of the offset voltage is smaller than or equal to the second threshold value so as to cause the amplitude of the offset voltage to be smaller than or equal to the first threshold value, wherein the second threshold value is greater than the first threshold value.

5. The auto-zero circuit of the operational amplifier according to claim 1, wherein the micro-control unit further generates a prompt signal according to the current environment temperature and the initial temperature, in order to trigger the operational amplifier to execute the auto-zero operation.

6. The auto-zero circuit of the operational amplifier according to claim 5, wherein the micro-control unit further obtains a voltage value of a current offset voltage of the output end corresponding to the current environment temperature according to the current environment temperature; the micro-control unit obtains a voltage value of an initial offset voltage of the output end corresponding to the initial temperature according to the initial temperature; and the micro-control unit generates a prompt signal according to the voltage value of the current offset voltage and the voltage value of the initial offset voltage, in order to trigger the operational amplifier to execute the auto-zero operation.

7. The auto-zero circuit of the operational amplifier according to claim 6, wherein the micro-control unit further determines whether the difference between the voltage value of the current offset voltage and the voltage value of the initial offset voltage is greater than a third threshold value, in order to generate a determination result.

8. The auto-zero circuit of the operational amplifier according to claim 7, wherein the micro-control unit further triggers the operational amplifier to execute the auto-zero operation when the determination result is that the difference between the voltage value of the current offset voltage and the voltage value of the initial offset voltage is greater than the third threshold value.

9. A auto-zero circuit of an operational amplifier, comprising:
- an operational amplifier including an input end, an output end and an auto-zero end, wherein the input end receives a input signal; the output end processes the input signal to generate an output signal; and the auto-zero end executes an auto-zero operation for the operational amplifier;
- an analog-to-digital converter converting the output signal to a digital signal;
- a micro-control unit obtaining a voltage value of an offset voltage of the output end according to the digital signal when there are no input signals in the input end, and generating a control signal according to the voltage value of the offset voltage, wherein the control signal causes the voltage value of the offset voltage to be smaller than a first threshold value; and
- a digital potentiometer adjusting a resistance thereof according to the control signal, in order to execute the auto-zero operation for the operational amplifier.

10. The auto-zero circuit of the operational amplifier according to claim 9, wherein the micro-control unit further compares an amplitude of the offset voltage to the first threshold value so as to generate a comparison result and generates the control signal according to the comparison result.

11. The auto-zero circuit of the operational amplifier according to claim 10, wherein the micro-control unit further generates the control signal when the comparison result is that the amplitude of the offset voltage is greater than the first threshold value.

12. The auto-zero circuit of the operational amplifier according to claim 9, wherein the digital potentiometer comprises a first digital potentiometer and a second digital potentiometer, the first digital potentiometer significantly adjusts the resistance; and the second digital potentiometer slightly adjusts the resistance.

13. The auto-zero circuit of the operational amplifier according to claim 12, wherein the micro-control unit further adjusts a resistance of the first digital potentiometer when the amplitude of the offset voltage is greater than a second threshold value so as to cause an amplitude of the offset voltage to be smaller than or equal to the second threshold value;
wherein the micro-control unit adjusts a resistance of the second digital potentiometer when the amplitude of the offset voltage is smaller than or equal to the second threshold value so as to cause the amplitude of the offset voltage to be smaller than or equal to the first threshold value, wherein the second threshold value is greater than the first threshold value.

14. The auto-zero circuit of the operational amplifier according to claim 9, wherein the auto-zero circuit further comprises a temperature sensing module, wherein the temperature sensing module detects a current environment temperature and records an initial temperature after finishing the previous auto-zero operation.

15. The auto-zero circuit of the operational amplifier according to claim 14, wherein the micro-control unit further generates a prompt signal according to the current environment temperature and the initial temperature, in order to trigger the operational amplifier to execute the auto-zero operation.

16. The auto-zero circuit of the operational amplifier according to claim 15, wherein the micro-control unit further obtains a voltage value of a current offset voltage of the output end corresponding to the current environment temperature according to the current environment temperature; the micro-control unit obtains a voltage value of an initial offset voltage of the output end corresponding to the initial temperature according to the initial temperature; and the micro-control unit generates a prompt signal according to the voltage value of the current offset voltage and the voltage value of the initial offset voltage, in order to trigger the operational amplifier to execute the auto-zero operation.

17. The auto-zero circuit of the operational amplifier according to claim 16, wherein the micro-control unit further determines whether the difference between the voltage value of the current offset voltage and the voltage value of the initial offset voltage is greater than a third threshold value, in order to generate a determination result.

18. The auto-zero circuit of the operational amplifier according to claim 17, wherein the micro-control unit further triggers the operational amplifier to execute the auto-zero operation when the determination result is that the difference between the voltage value of the current offset voltage and the voltage value of the initial offset voltage is greater than the third threshold value.

* * * * *